(12) United States Patent
Lundberg et al.

(10) Patent No.: US 7,990,180 B2
(45) Date of Patent: Aug. 2, 2011

(54) FAST DYNAMIC REGISTER

(75) Inventors: James R. Lundberg, Austin, TX (US); Imran Qureshi, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 31 days.

(21) Appl. No.: 12/555,999

(22) Filed: Sep. 9, 2009

(65) Prior Publication Data

US 2011/0058641 A1    Mar. 10, 2011

(51) Int. Cl.
*H03K 19/096*    (2006.01)
*H03K 19/00*    (2006.01)

(52) U.S. Cl. ............... 326/95; 326/93; 326/98; 327/199; 327/200; 327/201

(58) Field of Classification Search .................... 326/93, 326/95–98; 327/199–201
See application file for complete search history.

(56) References Cited

U.S. PATENT DOCUMENTS

| | | | | |
|---|---|---|---|---|
| 5,075,386 | A | | 12/1991 | Vanderbilt |
| 5,880,608 | A | * | 3/1999 | Mehta et al. ............ 326/93 |
| 5,889,979 | A | | 3/1999 | Miller, Jr. et al. |
| 5,926,038 | A | | 7/1999 | Fouts et al. |
| 6,060,910 | A | * | 5/2000 | Inui ............................ 326/98 |
| 6,172,532 | B1 | * | 1/2001 | Nishio et al. ............ 326/121 |
| 6,191,618 | B1 | * | 2/2001 | Gayles et al. ............ 326/95 |
| 6,265,899 | B1 | * | 7/2001 | Abdel-Hafeez et al. ........ 326/96 |
| 6,420,904 | B1 | * | 7/2002 | Dutta et al. .............. 326/93 |
| 6,429,689 | B1 | * | 8/2002 | Allen et al. .............. 326/95 |
| 6,486,706 | B2 | * | 11/2002 | Ye et al. .................. 326/98 |
| 6,496,038 | B1 | * | 12/2002 | Sprague et al. .......... 326/95 |
| 6,560,737 | B1 | * | 5/2003 | Colon-Bonet et al. ........ 714/726 |
| 6,628,143 | B2 | | 9/2003 | Hsu et al. |
| 6,650,145 | B2 | * | 11/2003 | Ngo et al. ................. 326/98 |
| 6,956,406 | B2 | * | 10/2005 | Seningen et al. ............ 326/121 |
| 6,960,939 | B2 | * | 11/2005 | Ngo ........................... 326/95 |
| 7,064,584 | B2 | * | 6/2006 | Bertram et al. ............ 326/121 |
| 7,129,754 | B2 | * | 10/2006 | Ngo et al. ................. 326/97 |
| 7,157,930 | B2 | * | 1/2007 | Hirata ....................... 326/16 |
| 7,161,992 | B2 | * | 1/2007 | Anders et al. ............ 375/316 |
| 7,187,209 | B2 | * | 3/2007 | Bertram ................... 326/95 |
| 7,187,210 | B2 | * | 3/2007 | Lundberg et al. ............ 326/95 |
| 7,187,211 | B2 | * | 3/2007 | Lundberg et al. ............ 326/95 |
| 7,193,445 | B2 | * | 3/2007 | Bertram ................... 326/95 |
| 7,224,190 | B2 | * | 5/2007 | Haller et al. ............ 326/95 |
| 7,317,339 | B1 | * | 1/2008 | Qureshi et al. ............ 326/121 |
| 7,321,243 | B1 | * | 1/2008 | Qureshi et al. ............ 326/121 |
| 7,332,938 | B2 | * | 2/2008 | Al-Assadi et al. ............ 326/121 |
| 7,336,105 | B2 | * | 2/2008 | Chuang et al. ............ 326/121 |
| 7,348,806 | B2 | * | 3/2008 | Lundberg et al. ............ 326/93 |

(Continued)

*Primary Examiner* — Rexford N Barnie
*Assistant Examiner* — Matthew C Tabler
(74) *Attorney, Agent, or Firm* — Gary R. Stanford; James W. Huffman

(57) ABSTRACT

A fast dynamic register circuit including first and second precharge circuits, a keeper circuit and an output circuit. The first and second precharge circuits each precharge a corresponding one of a pair of precharge nodes and cooperate to minimize setup and hold times. If an input data node is low when the clock goes high, the first precharge node remains high causing the second precharge node to be discharged. Otherwise if the input node is high, the first precharge node is discharged and the second remains charged. Once either precharge node is discharged, the output state of the register remains fixed until the next rising clock edge independent of changes of the input data node. The fast dynamic register may be implemented with multiple inputs to perform common logic operations, such as OR, NOR, AND and NAND logic operations.

18 Claims, 5 Drawing Sheets

U.S. PATENT DOCUMENTS

| | | | |
|---|---|---|---|
| 7,382,161 B2* | 6/2008 | Lundberg et al. | 326/93 |
| 7,414,436 B1* | 8/2008 | Klim et al. | 326/93 |
| 7,417,465 B2* | 8/2008 | Lundberg et al. | 326/95 |
| 7,429,880 B2* | 9/2008 | Rana et al. | 326/98 |
| 7,492,203 B2* | 2/2009 | Kim | 327/218 |
| 7,501,850 B1* | 3/2009 | Correale et al. | 326/16 |
| 7,557,616 B2* | 7/2009 | Klim et al. | 326/93 |
| 7,663,408 B2* | 2/2010 | Masleid et al. | 326/112 |
| 7,710,155 B2* | 5/2010 | Bhatia et al. | 326/93 |
| 2002/0158670 A1 | 10/2002 | Alvandpour | |
| 2003/0042932 A1 | 3/2003 | Bales | |
| 2003/0052714 A1* | 3/2003 | Alvandpour | 326/98 |
| 2003/0110404 A1* | 6/2003 | Seningen et al. | 713/320 |
| 2004/0034681 A1* | 2/2004 | Bertram | 708/654 |
| 2004/0051560 A1* | 3/2004 | Belluomini et al. | 326/98 |
| 2004/0056685 A1* | 3/2004 | Azam et al. | 326/95 |
| 2004/0113658 A1* | 6/2004 | Lundberg | 326/95 |
| 2004/0257115 A1* | 12/2004 | Bertram et al. | 326/98 |
| 2005/0046446 A1* | 3/2005 | Qureshi et al. | 326/95 |
| 2005/0110522 A1* | 5/2005 | Hoekstra | 326/95 |
| 2005/0127952 A1* | 6/2005 | Bertram | 326/98 |
| 2006/0033534 A1* | 2/2006 | Lundberg et al. | 326/98 |
| 2006/0038589 A1* | 2/2006 | Lundberg et al. | 326/98 |
| 2006/0038590 A1* | 2/2006 | Lundberg et al. | 326/98 |
| 2006/0158226 A1* | 7/2006 | Bertram | 326/98 |
| 2007/0290719 A1* | 12/2007 | Qureshi et al. | 326/95 |
| 2007/0290720 A1* | 12/2007 | Qureshi et al. | 326/95 |
| 2008/0036501 A1 | 2/2008 | Lundberg et al. | |
| 2008/0036502 A1* | 2/2008 | Lundberg et al. | 326/98 |
| 2009/0108874 A1* | 4/2009 | Klim et al. | 326/95 |
| 2009/0108875 A1* | 4/2009 | Klim et al. | 326/95 |

* cited by examiner

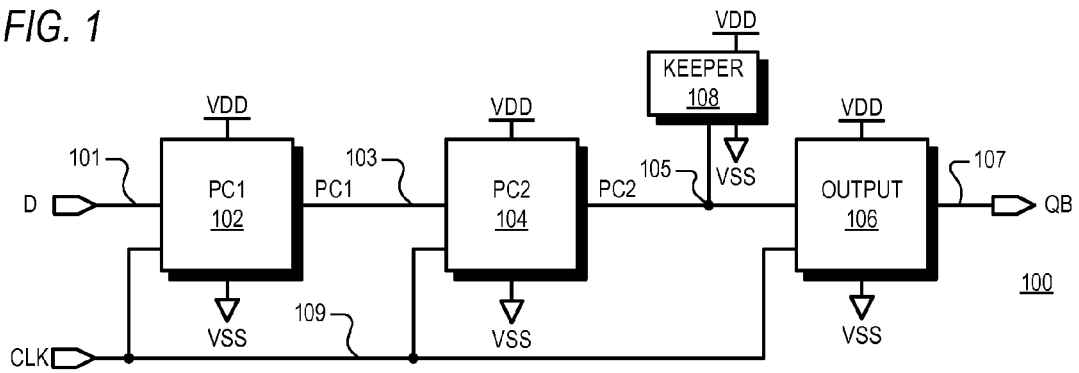
FIG. 1
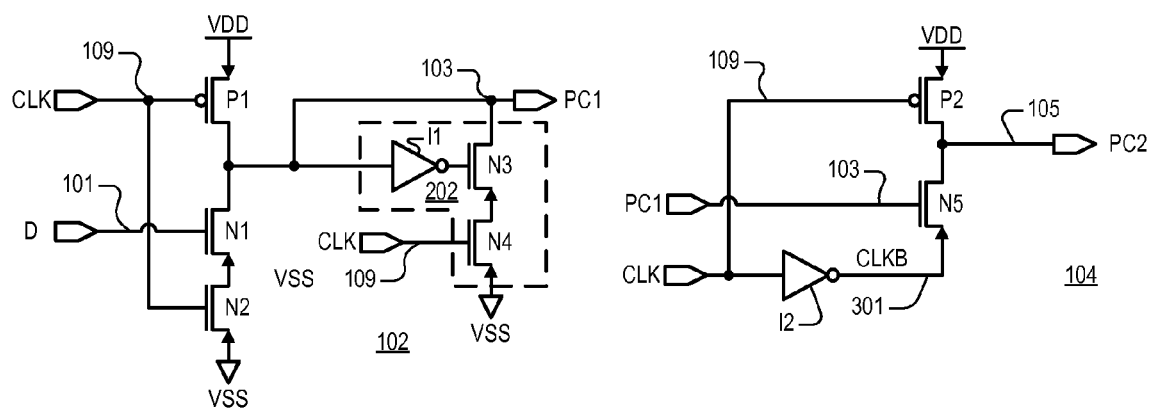
FIG. 2                                           FIG. 3
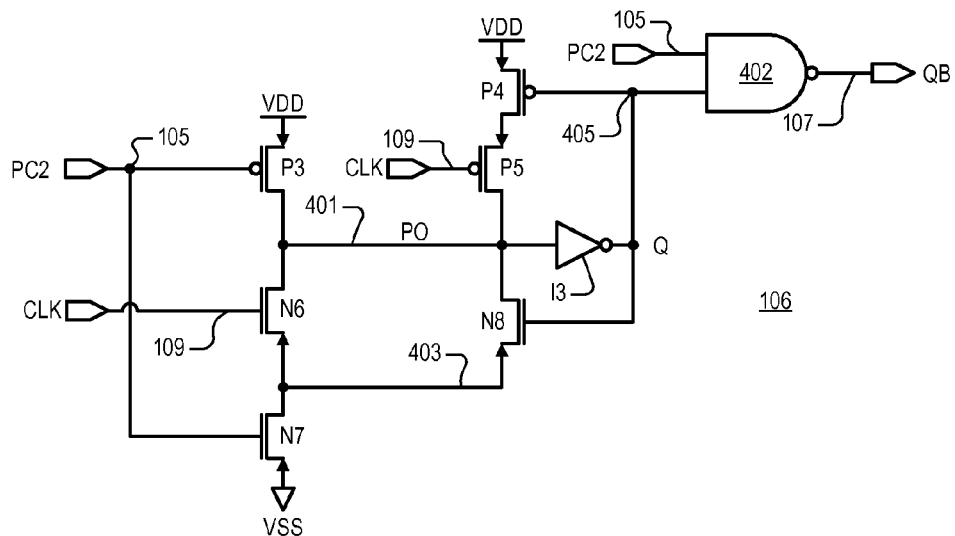
FIG. 4

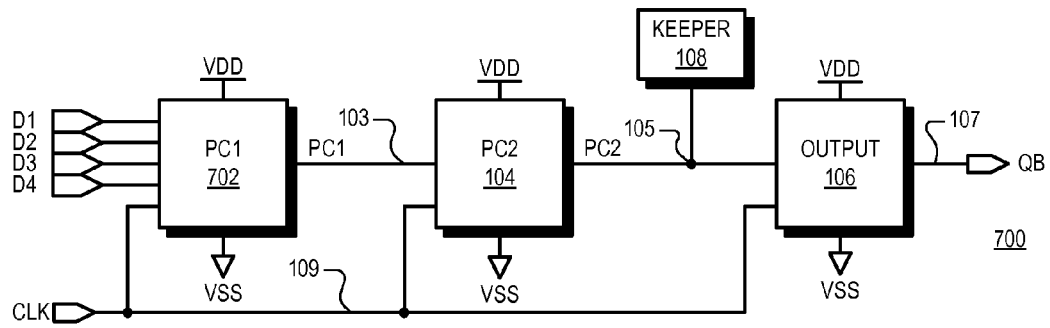
FIG. 7
| D1 | D2 | D3 | D4 | QB |
|----|----|----|----|----|
| 0  | 0  | 0  | 0  | 1  |
| 1  | X  | X  | X  | 0  |
| X  | 1  | X  | X  | 0  |
| X  | X  | 1  | X  | 0  |
| X  | X  | X  | 1  | 0  |
FIG. 8
| D1 | D2 | QB |
|----|----|----|
| 0  | 0  | 1  |
| 0  | 1  | 1  |
| 1  | 0  | 1  |
| 1  | 1  | 0  |
FIG. 11
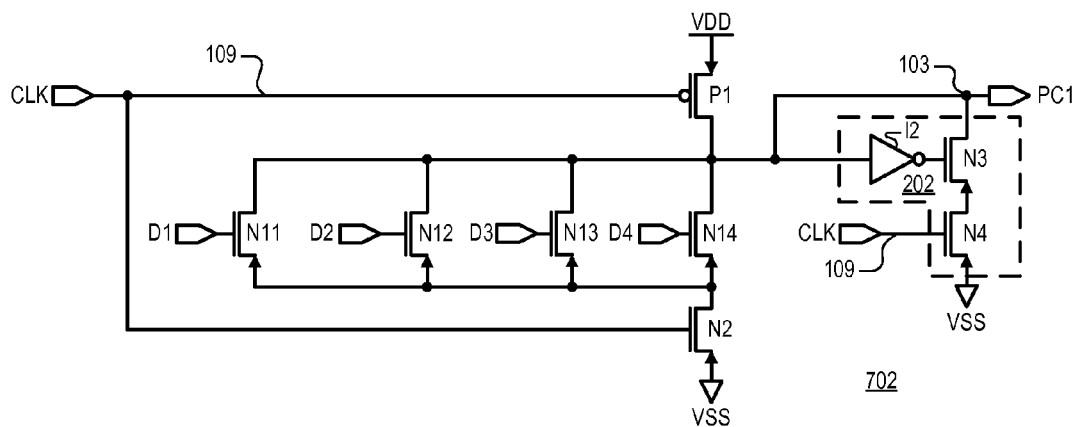
FIG. 9

FAST DYNAMIC REGISTER

BACKGROUND OF THE INVENTION

1. Field of the Invention

The present invention relates to latch and register circuits, and more particularly to a fast dynamic register.

2. Description of the Related Art

Dynamic logic circuits often exhibit relatively long setup and/or hold times to ensure proper operation. In many dynamic register circuits, the data had to be held while the clock was at a particular state, which was significantly disadvantageous for certain clock signals at or near 50% duty cycle. In a fast path of a digital circuit, buffers were often required to hold the data for the requisite amount of time. Buffers, however, consume valuable space and power. One method of reducing the hold time was to provide a pulsed clock generator. A pulse clock generator, however, also consumes valuable space and power.

There is a need for providing a fast dynamic register circuit with minimal setup and hold times without the overhead of buffers and/or pulsed clock circuits.

SUMMARY OF THE INVENTION

A fast dynamic register circuit according to one embodiment includes first and second precharge circuits, a full keeper circuit and an output circuit. The first precharge circuit precharges a first precharge node high while a clock node is low, maintains the first precharge node high after the clock node goes high when a data node is low, discharges the first precharge node low if the data node is high when the clock node goes high, and keeps the first precharge node discharged low while the clock node is high if the first precharge node was discharged low when the clock node went high. The second precharge circuit precharges a second precharge node high while the clock node is low, and discharges the second precharge node low if the first precharge node remains high after the clock node went high. The full keeper circuit keeps a state of the second precharge node immediately after either one of the first and second precharge nodes switches state while the clock node is high. The output circuit drives an output node to a state based on the second precharge node immediately after either one of the first and second precharge nodes switches state after the clock signal goes high and which otherwise maintains a state of the output node.

The fast dynamic register circuit may be implemented as a multiple input NOR logic gate in which multiple data nodes form the inputs. In this case, the first precharge circuit precharges the first precharge node high while the clock node is low, maintains the first precharge node high after the clock node goes high when each of the data nodes is low, discharges the first precharge node low if any of the data nodes are high when the clock node goes high, and keeps the first precharge node discharged low while the clock node is high if the first precharge node was discharged when the clock node went high.

The fast dynamic register circuit may be implemented as a multiple input NAND logic gate. In this case, multiple first precharge circuits are provided, each precharging a corresponding one of multiple first precharge nodes high while the clock node is low, each maintaining a corresponding one of the first precharge nodes high after the clock node goes high when a corresponding data node is low, each discharging a corresponding first precharge node low if a corresponding data nodes is high when the clock node goes high, and each keeping a corresponding first precharge node discharged low while the clock node is high if the corresponding first precharge node was discharged low when the clock node went high. Also, the second precharge circuit precharges the second precharge node high while the clock node is low and discharges the second precharge node low if at least one first precharge node remains high after the clock node goes high.

An integrated circuit, according to one embodiment includes combinatorial logic which provides a data signal and a fast dynamic register for registering the data.

A method of registering data according to one embodiment includes precharging a first precharge node high while a clock node is low, maintaining the first precharge node high after the clock node goes high when a data node is low, discharging the first precharge node low if the data node is high when the clock node goes high, keeping the first precharge node discharged low while the clock node is high if the first precharge node was discharged low when the clock node went high, precharging a second precharge node high while the clock node is low, discharging the second precharge node low if the first precharge node remains high after the clock node went high, keeping a state of the second precharge node immediately after either one of the first and second precharge nodes switches state while the clock node is high, and asserting an output node to a state based on the second precharge node immediately after either one of the first and second precharge nodes switches state after the clock signal goes high and otherwise maintaining a state of the output node.

BRIEF DESCRIPTION OF THE DRAWINGS

The benefits, features, and advantages of the present invention will become better understood with regard to the following description, and accompanying drawings where:

FIG. 1 is a block diagram of a fast dynamic register according to one embodiment;

FIG. 2 is a schematic diagram of the first precharge circuit of the fast dynamic register of FIG. 1 according to one embodiment;

FIG. 3 is a schematic diagram of the second precharge circuit of the fast dynamic register of FIG. 1 according to one embodiment;

FIG. 4 is a schematic diagram of the output circuit of the fast dynamic register of FIG. 1 according to one embodiment;

FIG. 7 is a block diagram of a fast dynamic register operating as a multi-input NOR gate according to one embodiment;

FIG. 8 is a logic truth table illustrating logical operation of the fast dynamic register of FIG. 7;

FIG. 9 is a schematic diagram of the first precharge circuit of the fast dynamic register of FIG. 7 according to one embodiment;

FIG. 11 is a logic truth table illustrating logical operation of the fast dynamic register of FIG. 10;

DETAILED DESCRIPTION

Figure 5:
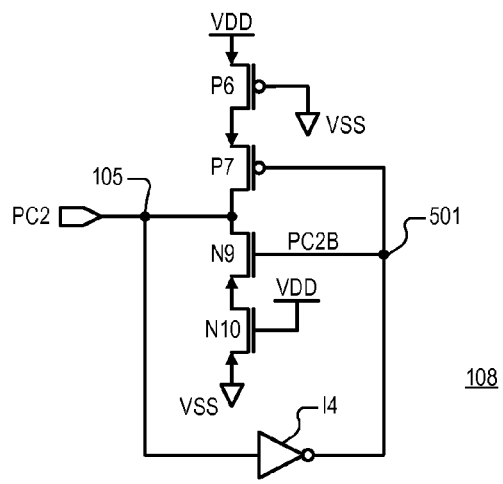
FIG. 5 is a schematic diagram of the full keeper circuit of the fast dynamic register of FIG. 1 according to an exemplary embodiment.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventor has observed that dynamic logic circuits often exhibit relatively long setup and/or hold times to ensure proper operation. In many dynamic register circuits, the data had to be held while the clock was at a particular state, which was significantly disadvantageous for certain clock signals at or near 50% duty cycle. In a fast path of a digital circuit, buffers were often required to hold the data for the requisite amount of time. Buffers, however, consume valuable space and power. One method of reducing the hold time was to provide a pulsed clock generator. A pulse clock generator, however, also consumes valuable space and power. The present inventor has therefore developed a fast dynamic register, as will be further described below with respect to FIGS. 1-13.

FIG. 1 is a block diagram of a fast dynamic register 100 according to one embodiment. The register 100 includes a first precharge circuit 102 (PC1), a second precharge circuit 104 (PC2), an output circuit 106, and a full keeper circuit 108 all coupled between upper and lower source voltages VDD and VSS, respectively. VDD may be any suitable source voltage level, such as 1.1 Volts (V), 1.3V, 1.5V, 3V, 5V, etc., and VSS is also any appropriate voltage level, such as 0V or ground. An input node 101 provides a data signal D to an input of the precharge circuit 102, which has an output coupled to node 103 providing a signal PC1 to an input of the precharge circuit 104. The precharge circuit 104 outputs a signal PC2 on node 105, which is coupled to one input of the output circuit 106. The output of the output circuit 106 provides an output signal QB on node 107. A clock signal CLK is provided via node 109 to each of the circuits 102, 104 and 106. The full keeper circuit 108 is coupled to node 105 to maintain the state of PC2 as further described below. The signals described herein generally operate between the source voltage levels VDD and VSS unless otherwise specified. For example, the CLK signal toggles between voltage levels VSS and VDD having any suitable duty cycle. As described herein, the fast dynamic register 100 is configured to provide relatively short set-up and hold times regardless of the duty cycle of CLK. CLK does not have to be a pulse clock signal so that a separate pulse clock generator is not necessary.

In operation of the fast dynamic register 100, PC1 and PC2 are pre-charged high to VDD while CLK is low. When CLK goes high, D is effectively sampled by the precharge circuit 102 which either maintains PC1 high or discharges PC1 low. If PC1 remains high, PC2 is discharged low by the precharge circuit 104. When PC2 is discharged low, QB goes high (or stays high). If PC1 is discharged low, then PC2 stays high and QB goes low (or stays low). Once either PC1 or PC2 discharges low while CLK is high, the output QB of the fast dynamic register 100 is determined and the D signal may change state without changing QB. The state of QB is determined by the state of PC2 relatively quickly after the rising edge of CLK. In this manner, the hold time of the register 100 is relatively short. When CLK goes back low, the PC1 and PC2 signals are once again pre-charged high and the state of QB is maintained by the precharge circuit 106.

FIG. 2 is a schematic diagram of the precharge circuit 102 according to one embodiment. Node 109 providing the CLK signal is coupled to the gate of a P-channel device P1, having its source coupled to VDD and its drain coupled to node 103 developing the PC1 signal. The D signal is provided to the gate of an N-channel device N1, having its drain coupled to node 103 and its source coupled to the drain of another N-channel device N2. N2 has its source coupled to VSS and its gate coupled to node 109 for receiving the CLK signal. Node 103 is further coupled to a clocked half-keeper circuit 202 including an inverter I1 and two N-channel devices N3 and N4. Node 103 is coupled to the input of inverter I1, having its output coupled to the gate of N3. The drain of N3 is coupled to node 103 and its source is coupled to the drain of N4. The source of N4 is coupled to VSS and its gate is coupled to node 109 for receiving the CLK signal.

In operation of the precharge circuit 102, when CLK is low P1 is turned on precharging node 103 pulling the PC1 signal high to VDD. The output of the inverter I1 is low so that N3 is off, and N2 is also off. When CLK goes high, P1 is turned off and N2 and N4 are turned on. If D is high when CLK goes high, then node 103 is discharged via N1 and N2 so that PC1 goes low. After PC1 goes low, any change of D is inconsequential and does not change the state of PC1. Also, the output of the inverter I1 of the clocked half-keeper circuit 202 goes high turning on N3. In this manner, node 103 is kept discharged via N3 and N4 to VSS so that PC1 is kept low while CLK is high. If instead D is low when CLK goes high, then N1 is off so that node 103 remains charged and PC1 remains high. PC1 is maintained at a high logic level while CLK is high. It is noted that if D goes from low to high while CLK is high, node 103 is discharged pulling PC1 low. As described further below, however, if PC1 remains high when CLK goes high, PC2 is discharged low relatively quickly. Once PC2 is discharged low, PC2 remains low even if PC1 is subsequently pulled low while CLK is high, so that the change of the input D signal is inconsequential. In this manner, the fast dynamic register 100 has a relatively minimal hold time in that the state remains registered once either PC1 or PC2 is pulled low.

FIG. 3 is a schematic diagram of the precharge circuit 104 according to one embodiment. The clock node 109 is coupled to the input of an inverter I2 and to the gate of a P-channel device P2. The output of the inverter I2 is coupled to a node 301 developing an inverted clock signal CLKB. A "B" appended to the end of a signal name denotes a logically inverted signal unless otherwise specified. For example, when CLK is high, CLKB is low and vice-versa. The source of P2 is coupled to VDD and its drain is coupled to node 105. The drain of an N-channel device N5 is coupled to node 105, its gate is coupled to node 103 for receiving the PC1 signal, and its source is coupled to node 301.

In operation of the precharge circuit 104, when CLK is low, P2 is on which pre-charges node 105 to VDD thus pulling PC2 to a high logic level. The inverter I2 drives node 301 high so that node 301 is pre-charged high and CLKB is high. Although PC1 is pre-charged high as previously described, N5 is off since CLKB is also high. When CLK goes high, P2 is turned off and inverter I2 begins discharging node 301 low. If PC1 remains high after CLK goes high (such as when D is low), then N5 turns on as CLKB decreases so that PC2 is pulled low by the inverter I2. If instead PC1 is pulled low (such as when D is high) after CLK goes high, then N5 remains off so that PC2 remains high.

FIG. 4 is a schematic diagram of the output circuit 106 according to one embodiment. Node 109 providing the CLK signal is provided to the gate of an N-channel device N6 and to the gate of a P-channel device P5. Node 105 providing PC2 is coupled to the gate of a P-channel device P3, to the gate of an N-channel device N7, and to one input of a two-input logic NAND gate 402. The output of the NAND gate 402 provides the output signal QB. The source of P3 is coupled to VDD and its drain is coupled to node 401 developing a preliminary output signal PO. The drain of N6 is coupled to node 401 and its source is coupled at node 403 to the drain of N7, which has its source coupled to VSS. Node 401 is coupled to the input of an inverter I3, having its output coupled to node 405 developing an inverted output signal Q. Node 405 is further coupled to the gate of a P-channel device P4, to the gate of an N-channel device N8, and to the other input of the NAND gate 402. P4 has its source coupled to VDD and its drain coupled to the source of P5, which has its drain coupled to node 401. N8 has its drain coupled to node 401 and its source coupled to node 403. It is noted that the output circuit 106 may be configured as an SR latch with cross-coupled NAND gates as understood by those skilled in the art. In the cross-coupled configuration, the NAND gate 402 is configured as shown with PC2 and Q as inputs and QB as its output. The second NAND gate (not shown) has one input receiving QB, its other input receiving CLKB, and its output asserting signal Q. Operation is substantially similar.

In operation of the output circuit 106, when CLK is low, N6 is off and PC2 is precharged high turning off P3 and turning N7 on thereby discharging node 403. If the inverter I3 asserts Q high (such as from a prior cycle), then P4 is off and N8 is on pulling PO low via N7 and N8 thereby keeping Q high. Q and PC2 are both high so that QB is low. Otherwise, if the inverter I3 asserts Q low, then N8 is off and P4 is on so that PO is pulled high via P4 and P5. In this case, QB is high. The devices P4, P5, N7 and N8 and the inverter I3 collectively operate as a full keeper circuit to maintain the state of PO and Q while CLK is low.

When CLK goes high, N6 is turned on and P5 is turned off. It is noted that when CLK initially goes high while PC2 is high and if PO was also high, N6 and N7 are both turned on to discharge node 401 to begin pulling PO low. If PC1 stays high (such as when D is low), then the inverter I2 discharges nodes 301 and 105 relatively quickly so that PC2 drops sufficiently fast before node 401 is discharged by a significant amount. As PC2 decreases, N7 begins turning off to reduce discharge current from node 401 while P3 begins turning on to add charging current to node 401. Thus, if PO is initially high, it momentarily "glitches" below VDD. When PC2 is sufficiently low, P3 is turned on and N7 is turned off so that PO is pulled back high. The devices N5, N6 and N7, and the inverter I2 are configured such that the voltage of node 401 does not drop significantly during this condition so that PO remains at a logic high level, so that the inverter I3 maintains Q low. If instead PO was initially low when CLK goes high and PC1 stays high, then this condition is inconsequential and PO is eventually pulled high by P3 when PC2 goes low. When PO is high, the inverter I3 pulls Q low. In either case, Q goes low turning P4 on. When CLK next goes back low, P5 turns on pulling PO high via P4 and P5 to maintain Q low. In either case, QB remains high.

If instead PC1 is pulled low (such as when D is high) after CLK goes high, then N5 remains off so that PC2 remains high. N6 is turned on and node 401 is discharged low to pull PO low via N6 and N7. Thus, if PO was high it goes low, and if PO was already low, then it does not change state in response to CLK going high. In this case the inverter I3 pulls Q high turning N8 on to pull PO low via N8 and N7 to maintain the high state of Q. Since PC2 and QB are both high, QB is low. When CLK next goes low, PC1 and PC2 are once again pre-charged high and the states of Q and QB are maintained.

FIG. 5 is a schematic diagram of the full keeper circuit 108 according to an exemplary embodiment. Node 105 providing the PC2 signal is coupled to the input of an inverter I4, which has its output coupled to node 501 to drive an inverted pre-charge signal PC2B. A P-channel device P6 has its source coupled to VDD, its gate coupled to VSS, and its drain coupled to the source of another P-channel device P7. P7 has its drain coupled to node 105 and its gate coupled to node 501. An N-channel device N9 has its drain coupled to node 105, its gate coupled to node 501, and its source coupled to the drain of another N-channel device N10. N10 has its gate coupled to VDD and its source coupled to VSS. P6 and N10 are kept on and generally operate to make the keeper circuit 108 weaker. In one embodiment, P6 and N10 are long-channel devices. It is noted that P7 and N9 may alternatively be made as long-channel devices thereby eliminating P6 and N10, except that such configuration would increase the gate capacitance of P7 and N9 so that the drive capacity of the inverter I4 would be increased.

In operation of the keeper circuit 108, when CLK is low, PC2 is pre-charged high as previously described and the inverter I4 drives PC2B low turning on P7 and turning off N9. Thus, PC2 is pulled high via P6 and P7. When CLK goes high, if PC2 stays high and is not otherwise driven low, the inverter I4 maintains PC2B to keep PC2 pulled high via P6 and P7. If PC2 is driven low by the inverter I2, then the inverter 14 switches to pull PC2B high turning on N9 and turning off P7. PC2 is pulled low via N9 and N10 while CLK is high. When CLK goes back high, PC2 is once again pre-charged high pulling PC2B low. In an alternative embodiment, the full keeper circuit 108 is configured as a clocked full keeper circuit using clock signals CLK and CLKB as understood by those of ordinary skill in the art.

Figure 6:
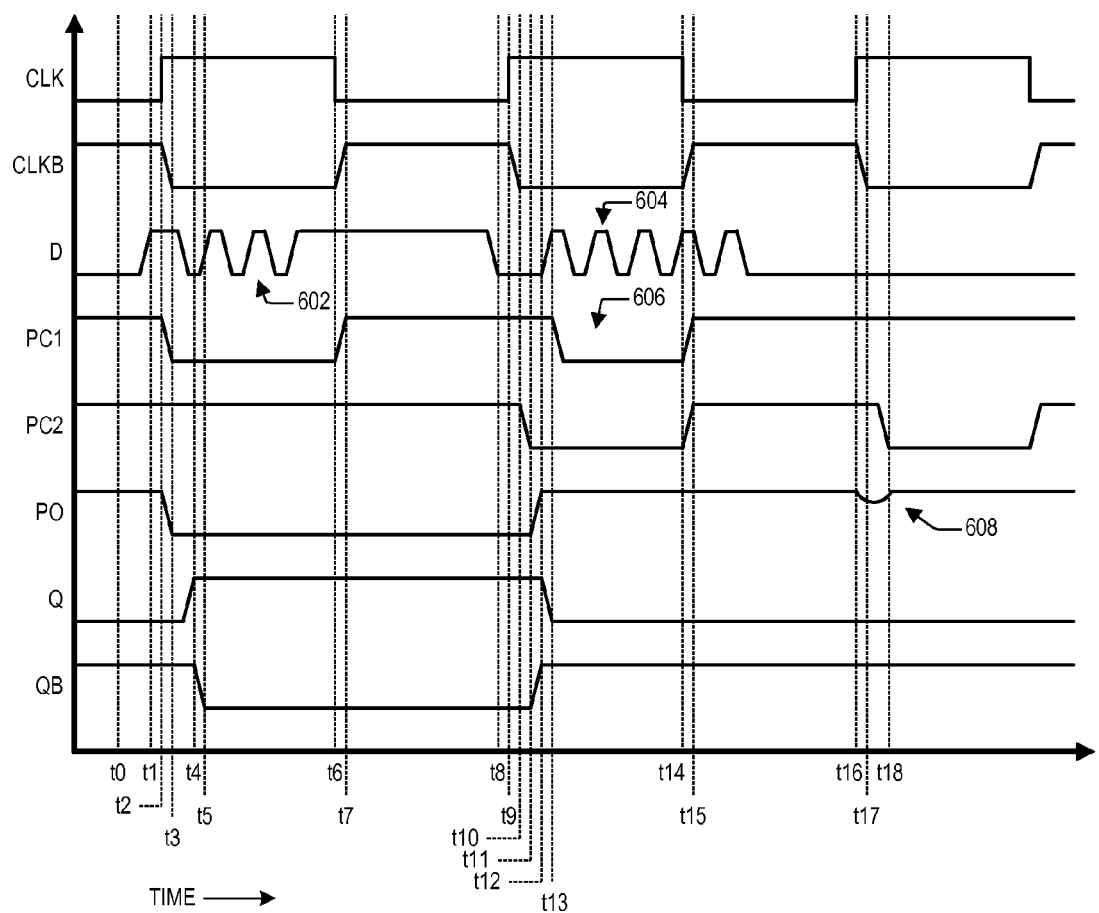
FIG. 6 is a timing diagram illustrating operation of the fast dynamic register of FIG. 1 according to one embodiment.

FIG. 6 is a timing diagram illustrating operation of the fast dynamic register 100 according to one embodiment. The signals CLK, CLKB, D, PC1, PC2, PO, Q and QB are plotted versus time. The CLK signal is low at an initial time t0 and generally toggles between high and low logic values at a selected frequency with any suitable duty cycle, such as, for example, a 50% duty cycle. It is noted that successful register operation is achieved without CLK having to be pulsed. CLKB toggles in similar manner opposite CLK with slight delay (operation of inverter I2). D is initially low and PC1 and PC2 are both pre-charged high at time t0. PO and QB are both initially high and Q is low. D goes high at about time t1 just before CLK goes high at subsequent time t2. Since D and CLK are both high at time t2, PC1 is discharged through N1 and N2 just after time t2 and thus goes low at subsequent time t3. CLKB also goes low at about time t3 even though N5 is turned off so that PC2 remains asserted high after time t2. Since Q and CLK are both low before time t2, PO is held high via P4 and P5. As CLK goes high, P5 turns off while N6 turns on so that PO is pulled low via N6 and N7 after time t2 at about time t3. The inverter I3 pulls Q high at subsequent time t4 in response to PO going low. The output signal QB goes low at about time t5 in response to Q going high. Anytime after time t3 when PC1 falls low, D may change state without affecting operation. As shown at 602, D toggles several times after time t3 with no effect on the signals PC1, PC2, PO, Q or QB.

CLK goes back low at about time t6. The inverter I2 pulls CLKB high and P2 pre-charges PC1 back high at subsequent time t7 and PC2 stays high. Since Q is high after time t6, N8 is turned on keeping PO low, so that the inverter I3 keeps Q high while CLK is low. At subsequent time t8, D goes low just before CLK goes back high at subsequent time t9. N1 is turned off so that PC1 remains high just after time t9. The inverter I2 pulls CLKB low at time t10 turning N5 on since PC1 remains high. The inverter I2 further pulls PC2 low at subsequent time t11 as N5 turns on. As PC2 goes low, it turns P3 on which pulls PO high at subsequent time t12. Also, the output circuit 106 pulls QB high at about time t12. The inverter I3 pulls Q low at subsequent time t13 in response to PO going high. Anytime after time t11 when PC2 is low, D may change state without affecting operation. As shown at 604, D toggles several times after time t11 with no effect on the signals PC2, PO, Q or QB. This is true even though PC1 goes low in response to D going high as shown at 606, where PC1 stays low until precharged once again when CLK next goes low at time t14. When CLK next goes low at subsequent time t14, PC1 and PC2 are once again pre-charged high and CLKB also goes high at subsequent time t15. Further toggling of D has no effect during the pre-charged state. Since Q and CLK are both low, PO is held high via P4 and P5, so that the inverter I3 keeps Q low while CLK is low.

CLK goes high once again at time t16 while D is low and while PC2 is still high. As CLK rises, N6 is turning on while P5 is turning off. There is a slight contention since while the pull up of P4 and P5 for PO is turning off, the pull down of N6 and N7 for PO starts turning on. In one embodiment, P4 and P5 are configured as weak keeper devices. Meanwhile, CLKB goes low at subsequent time t17 turning N5 on since PC1 remains high. As N5 turns on, PC2 discharges low at subsequent time t18. PC2 eventually turns N7 off removing the pull down of N6 and N7, and PC2 turns P3 on adding further pull up on PO. The devices are sized and configured to maintain PO high after time t17, although a slight "glitch" shown at 608 may appear on PO as previously described. The slight dip of PO shown at 608 has no effect since the inverter I3 does not change state, so that the states of PO, Q and QB remain unmodified.

FIG. 7 is a block diagram of a fast dynamic register 700 operating as a multi-input NOR gate according to one embodiment. The register 700 is configured in similar manner as the register 100 except that the precharge circuit 102 is replaced by a similar precharge circuit 702. The remaining portion of the register 700 is configured in substantially identical manner as the register 100 including the precharge circuit 104, the output circuit 106 and the keeper circuit 108 coupled together in the same manner. The precharge circuit 702 has four inputs for receiving a corresponding four input signals D1, D2, D3 and D4 and asserts the PC1 signal at its output on node 103. FIG. 8 is a logic truth table of the inputs D1-D4 and the output QB illustrating logical operation of the register 700 configured as a NOR gate. If each of the inputs D1-D4 is a logic zero (0) as shown in the first row of the truth table, then the output QB is a logic one (1). Otherwise, if any of the inputs D1-D4 is a logic one, as shown in the remaining 4 rows of the table, then the output QB is a logic zero regardless of the logic value of the other inputs (as illustrated by an "X" denoting a "don't care" value).

FIG. 9 is a schematic diagram of the precharge circuit 702 according to one embodiment. The precharge circuit 702 is configured in substantially the same manner as the precharge circuit 102, except that N1 is replaced by four N-channel devices N11, N12, N13 and N14 effectively coupled in parallel between node 103 and the drain of N2. In particular, the drains of N11-N14 are coupled together at node 103 and the sources of N11-N14 are coupled together and to the drain of N2. D1 is provided to the gate of N11, D2 is provided to the gate of N12, D3 is provided to the gate of N13, and D4 is provided to the gate of N14. In operation, if D1-D4 are each low at the rising edge of CLK, then PC1 remains high and QB is asserted high in a similar manner as previously described. If instead any one of D1-D4 is high at the rising edge of CLK, then PC1 is discharged low by the inverter I2 and QB is asserted low in a similar manner as previously described.

Figure 10:
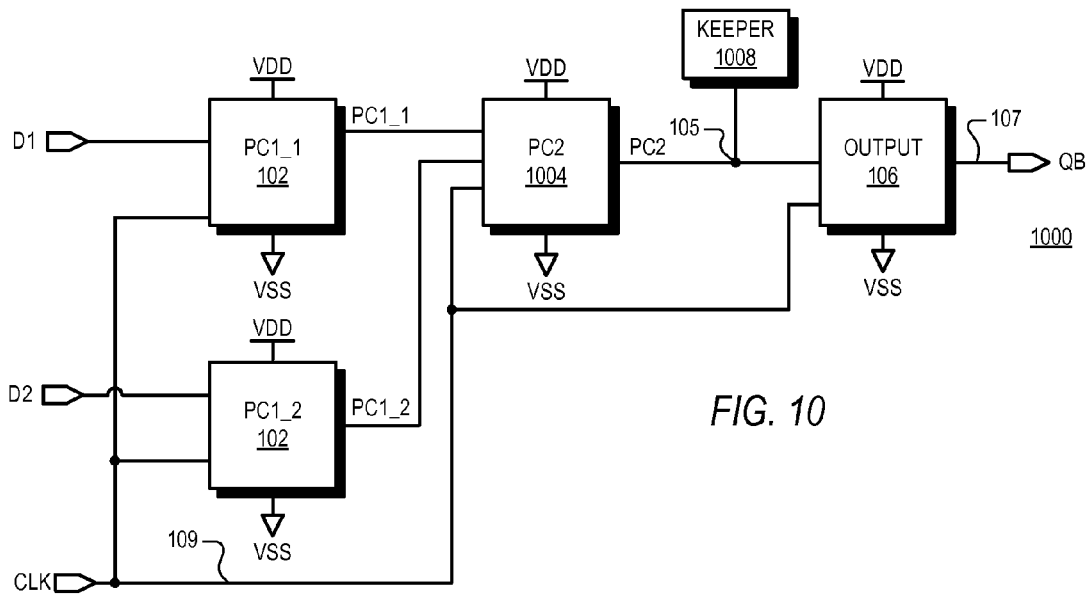
FIG. 10 is a block diagram of a fast dynamic register operating as a multi-input NAND gate according to one embodiment.

FIG. 10 is a block diagram of a fast dynamic register 1000 operating as a multi-input NAND gate according to one embodiment. The register 1000 is configured in similar manner as the register 100 except that it includes a pair of precharge circuits 102 each configured in the same manner and receiving a corresponding data signal and providing a corresponding PC1 signal. In particular, a first precharge circuit 102, shown as PC1_1, receives a first data signal D1 and provides a corresponding output signal PC1_1, and a second precharge circuit 102, shown as PC1_2, receives a second data signal D2 and provides a corresponding output signal PC1_2. Although only two precharge circuits 102 are shown, additional precharge circuits 102 may be included to increase the number of inputs of the register 1000. The precharge circuit 104 is replaced by a similar precharge circuit 1004, which receives the PC1 signals PC1_1 and PC1_2 and which provides the PC2 signal to the output circuit 106. The full keeper circuit 108 is replaced by another full keeper circuit 1008 which is further described below. FIG. 11 is a logic truth table of the inputs D1 and D2 and the output QB illustrating logical operation of the register 1000 configured as a NAND gate. In accordance with NAND gate operation, if either of the inputs D1 or D2 is a logic zero as shown in the first three rows of the truth table of FIG. 11, then the output QB is a logic one. Otherwise, if both inputs D1 and D2 are logic ones, as shown in the fourth row of the truth table, then the output QB is a logic zero.

Figure 12:
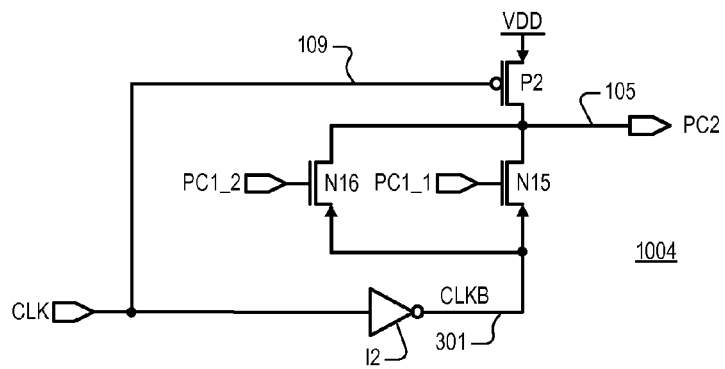
FIG. 12 is a schematic diagram of the precharge circuit of the fast dynamic register of FIG. 10 according to one embodiment.

FIG. 12 is a schematic diagram of the precharge circuit 1004 according to one embodiment. The precharge circuit 1004 is configured in a similar manner as the precharge circuit 104, except that N5 is replaced by a pair of N-channel devices N15 and N16 coupled in parallel between nodes 105 and 301 for receiving multiple input signals on corresponding input nodes. In particular, the drains of N15-N16 are coupled together at node 105 and the sources of N15-N16 are coupled together at node 301. D1 is provided to the gate of N15 and D2 is provided to the gate of N16. In operation, if either D1 or D2 is low at the rising edge of CLK, then the corresponding PC1 signal (PC1_1 or PC1_2) remains high and QB is asserted high in a similar manner as previously described. For example, if D1 is high when CLK goes high, then PC1_1 remains high and N15 turns on as the inverter I2 pulls node 301 low. If instead both D1 and D2 are high at the rising edge of CLK, then both PC1_1 and PC1_2 are discharged low so that PC2 stays high and QB is asserted low. Several other circuit modifications may be made. The size of the inverter I2 may be increased to turn on multiple N-channel devices more quickly. Also, although only two inputs are shown, additional precharge circuits 102 may be included in the register 1000 in which the precharge circuit 1004 is configured with additional N-channel devices in parallel to receive more input signals. Operation is similar in that the output QB is high unless each of the inputs is high upon the rising edge of CLK.

Figure 13:
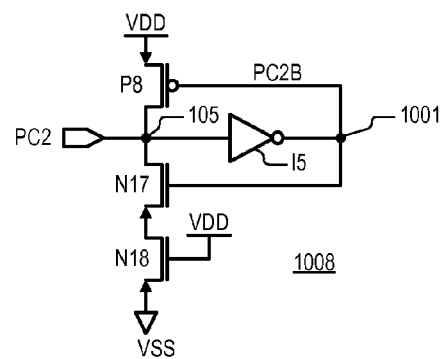
FIG. 13 is a schematic diagram of the full keeper circuit according to one embodiment.

FIG. 13 is a schematic diagram of the full keeper circuit 1008 according to one embodiment. A P-channel device P8 has its source coupled to VDD, its drain coupled to node 105, and its gate coupled to node 1001 developing the inverted PC2B signal. The input of an inverter I5 is coupled to node 105 and its output is coupled to node 1001. Node 105 is further coupled to the drain of an N-channel device N17, having its gate coupled to node 1001 and its source coupled to the drain of another N-channel device N18. The gate of N18 is coupled to VDD and its source is coupled to VSS. In operation, N18 remains turned on. When node 105 is high, the inverter I5 pulls node 1001 low turning on P8 to keep node 105 pulled high. When node 105 is low, the inverter I5 pulls node 1001 high turning on N17 to keep node 105 pulled low through N17 and N18.

Figure 14:
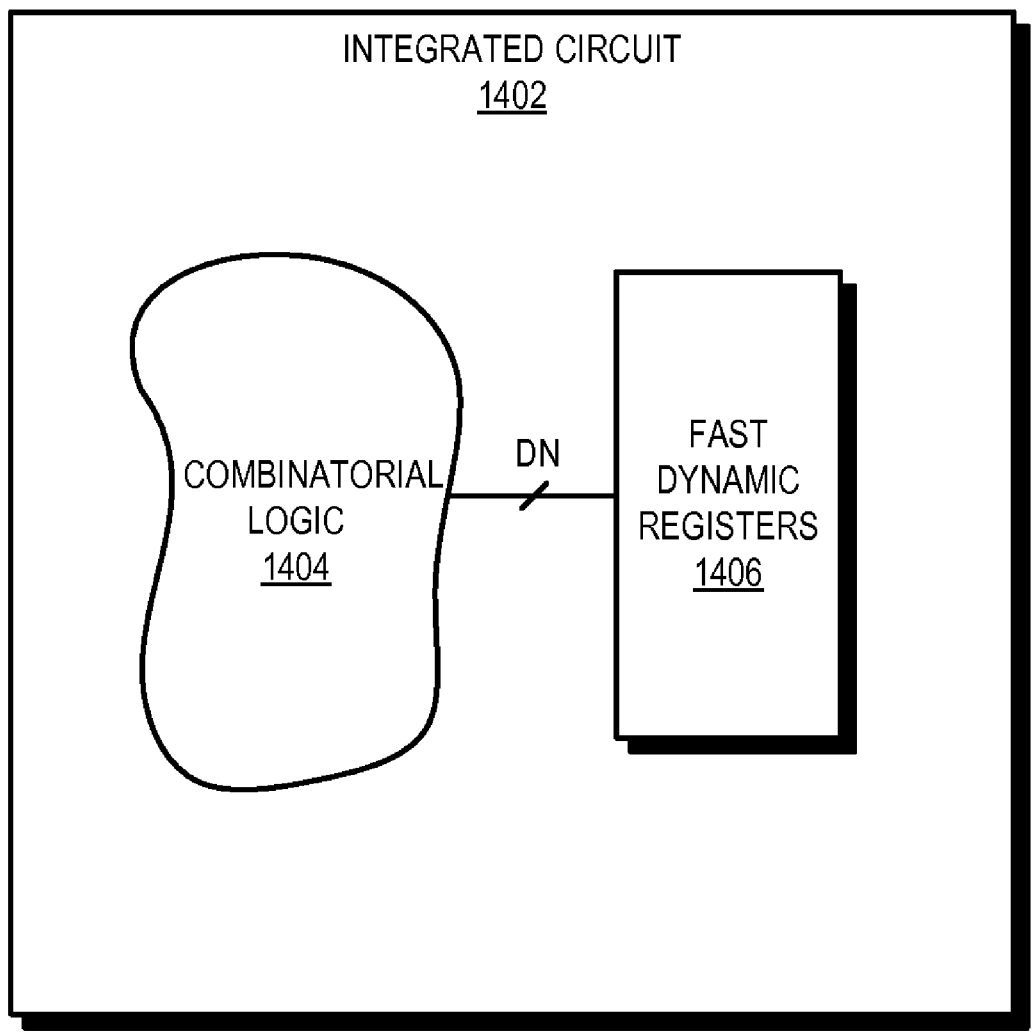
FIG. 14 is an integrated circuit incorporating fast dynamic registers according to at least one embodiment as described herein.

A fast dynamic register according to embodiments of the present invention are particularly advantageous on integrated circuits such as shown in FIG. 14. As shown, an integrated circuit 1402 incorporates any type of combinatorial logic 1404 generating one or more data signals DN which are registered by a corresponding one or more fast dynamic registers 1406 implemented as described herein. Although only one combinatorial logic 1404 and one set of dynamic registers 1406 is shown, it is appreciated that additional logic and registers may be included as needed or desired. For example, multiple sets of dynamic registers are contemplated, such as implementing one or more pipeline stages. The integrated circuit 1402 may be implemented according to any desired function or implementation, such as a microprocessor or the like. An integrated circuit incorporating fast dynamic registers according to that described herein provides many advantages. The integrated fast dynamic register logic has significantly reduced setup and hold times as compared to conventional register circuits enabling faster logic circuits that may be clocked at increased speeds. Furthermore, pulse clock logic is avoided since the fast dynamic register achieves minimal setup and hold times without the use of a pulsed clock signal.

A fast dynamic register circuit according the various embodiments as described herein includes first and second precharge circuits, a keeper circuit and an output circuit. The first and second precharge circuits each precharge a corresponding one of a pair of precharge nodes and cooperate to minimize setup and hold times. If an input data node is low when the clock goes high, the first precharge node remains high which causes the second precharge node to be discharged. Otherwise if the input node is high, the first precharge node is discharged and the second remains charged. Once either precharge node is discharged, the output state of the register remains fixed until the next rising clock edge independent of changes of the input data node. The fast dynamic register may be implemented with multiple inputs to perform common logic operations, such as OR, NOR, AND and NAND logic operations. Note, for example, that the NOR configuration of FIG. 7 may be converted to an OR configuration by inverting the output. Likewise, the NAND configuration of FIG. 10 is easily converted to an AND configuration in similar manner.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A fast dynamic register circuit, comprising:
   a first precharge circuit which precharges a first precharge node high while a clock node is low, which maintains said first precharge node high after said clock node goes high when a data node is low, which discharges said first precharge node low if said data node is high when said clock node goes high, and which keeps said first precharge node discharged low while said clock node is high if said first precharge node was discharged low when said clock node went high regardless of any change of said data node while said clock node is high;
   a second precharge circuit which precharges a second precharge node high while said clock node is low, and which discharges said second precharge node low if said first precharge node remains high after said clock node went high;
   a full keeper circuit which keeps a state of said second precharge node immediately after either one of said first and second precharge nodes switches state while said clock node is high; and
   an output circuit which drives an output node to a next state based on said second precharge node immediately after either one of said first and second precharge nodes switches state after said clock node goes high and which maintains said output node at said next state when said clock node next goes low regardless of any change of state of said second precharge node.

2. The fast dynamic register circuit of claim 1, wherein said first precharge circuit comprises:
   a first P-channel device having a source coupled to an upper source voltage, having a drain coupled to said first precharge node, and having a gate coupled to said clock node;
   a first N-channel device having a drain coupled to said first precharge node, having a source, and having a gate coupled to said data node;
   a second N-channel device having a drain coupled to said source of said first N-channel device, having a source coupled to a lower source voltage, and having a gate coupled to said clock node; and
   a half-keeper circuit coupled to said first precharge node, said lower source voltage, and said clock node, wherein said half-keeper circuit keeps said first precharge node discharged low while said clock node is high if said first precharge node is discharged low when said clock node went high.

3. The fast dynamic register circuit of claim 2, wherein said half-keeper circuit comprises:
   an inverter having an input coupled to said first precharge node and having an output;
   a third N-channel device having a drain coupled to said first precharge node, having a source, and having a gate coupled to said output of said inverter; and
   a fourth N-channel device having a drain coupled to said source of said third N-channel device, having a source coupled to said lower source voltage, and having a gate coupled to said clock node.

4. The fast dynamic register circuit of claim 1, wherein said second precharge circuit comprises:
   a first P-channel device having a source coupled to an upper source voltage, having a drain coupled to said second precharge node, and having a gate coupled to said clock node;

a first N-channel device having a drain coupled to said second precharge node, having a source coupled to an inverted clock node, and having a gate coupled to said first precharge node; and an inverter having an input coupled to said clock node and an output coupled to said inverted clock node.

5. The fast dynamic register circuit of claim 1, wherein said full keeper circuit comprises:

an inverter having an input coupled to said second precharge node and an output;

a first P-channel device having a source coupled to an upper source voltage, having a drain, and having a gate coupled to a lower source voltage;

a second P-channel device having a source coupled to said drain of said first P-channel device, having a drain coupled to said second precharge node, and having a gate coupled to said output of said inverter;

a first N-channel device having a source, having a drain coupled to said second precharge node, and having a gate coupled to said output of said inverter; and a second N-channel device having a source coupled to said lower source voltage, having a drain coupled to said source of said first N-channel device, and having a gate coupled to said upper source voltage.

6. The fast dynamic register circuit of claim 1, wherein said output circuit comprises:

an inverter having an input and an output;

a first P-channel device having a source coupled to an upper source voltage, having a drain coupled to said input of said inverter, and having a gate coupled to said second precharge node;

a first N-channel device having a drain coupled to said input of said inverter, having a source, and having a gate coupled to said clock node;

a second N-channel device having a drain coupled to said source of said first N-channel device, having a source coupled to a lower source voltage, and having a gate coupled to said second precharge node;

a second P-channel device having a source coupled to said upper source voltage, having a drain, and having a gate coupled to said output of said inverter;

a third P-channel device having a source coupled to said drain of said second P-channel device, having a drain coupled to said input of said inverter, and having a gate coupled to said clock node;

a third N-channel device having a drain coupled to said input of said inverter, having a source coupled to said drain of said second N-channel device, and having a gate coupled to said output of said inverter; and a logic circuit having a first input coupled to said second precharge node, a second input coupled to said output of said inverter, and an output coupled to said output node.

7. The fast dynamic register circuit of claim 6, wherein said logic circuit comprises a NAND gate.

8. The fast dynamic register circuit of claim 1, wherein said first precharge circuit precharges said first precharge node high while said clock node is low, which maintains said first precharge node high after said clock node goes high when each of a plurality of data nodes is low, which discharges said first precharge node low if any of said plurality of data nodes are high when said clock node goes high, and which keeps said first precharge node discharged low while said clock node is high if said first precharge node was discharged when said clock node went high.

9. The fast dynamic register circuit of claim 8, wherein said first precharge circuit comprises:

a first P-channel device having a source coupled to an upper source voltage, having a drain coupled to said first precharge node, and having a gate coupled to said clock node;

a plurality of first N-channel devices, each having a drain coupled to said first precharge node, having a source, and having a gate coupled to a corresponding one of said plurality of data nodes;

a second N-channel device having a drain coupled to said source of each of said plurality of first N-channel devices, having a source coupled to a lower source voltage, and having a gate coupled to said clock node; and a half-keeper circuit coupled to said first precharge node, said lower source voltage, and said clock node, wherein said half-keeper circuit keeps said first precharge node discharged low while said clock node is high if said first precharge node is discharged low when said clock node went high.

10. The fast dynamic register circuit of claim 1, wherein:

said first precharge circuit comprises a plurality of first precharge circuits, each precharging a corresponding one of a plurality of first precharge nodes high while said clock node is low, each maintaining a corresponding one of said plurality of said first precharge nodes high after said clock node goes high when a corresponding one of a plurality of data nodes is low, each discharging a corresponding one of said plurality of first precharge nodes low if a corresponding one of said plurality of data nodes is high when said clock node goes high, and each keeping a corresponding one of said plurality of first precharge nodes discharged low while said clock node is high if said corresponding first precharge node was discharged low when said clock node went high; and wherein said second precharge circuit precharges said second precharge node high while said clock node is low and discharges said second precharge node low if at least one of said plurality of first precharge nodes remains high after said clock node goes high.

11. The fast dynamic register circuit of claim 10, wherein said second precharge circuit comprises:

a first P-channel device having a source coupled to an upper source voltage, having a drain coupled to said second precharge node, and having a gate coupled to said clock node;

a plurality of first N-channel devices, each having a drain coupled to said second precharge node, each having a source coupled to an inverted clock node, and each having a gate coupled to a corresponding one of said plurality of first precharge nodes; and an inverter having an input coupled to said clock node and an output coupled to said inverted clock node.

12. The fast dynamic register circuit of claim 11, wherein said full keeper circuit comprises:

a second inverter having an input coupled to said second precharge node and having an output;

a second P-channel device having a source coupled to said upper source voltage, having a drain coupled to said second precharge node, and having a gate coupled to said output of said inverter;

a second N-channel device having a drain coupled to said second precharge node, having a source, and having a gate coupled to said output of said inverter; and a third N-channel device having a drain coupled to said source of said second N-channel device, having a source coupled to said lower source voltage, and having a gate coupled to said upper source voltage.

13. An integrated circuit, comprising:
combinatorial logic which provides a data signal; and
a fast dynamic register, comprising:
- a first precharge circuit which asserts a first signal high while a clock is low, which maintains said first signal high after said clock goes high when said data signal is low, which asserts said first signal low if said data signal is high when said clock goes high, and which keeps said first signal low while said clock is high if said first signal was asserted low when said clock went high regardless of any change of said data signal while said clock is high;
- a second precharge circuit which asserts a second signal high while said clock is low, which asserts said second signal low if said first signal remains high after said clock goes high, which keeps a state of said second signal immediately after either one of said first and second signals switches state while said clock is high; and
- an output circuit which drives an output signal to a next state based on said second signal immediately after either one of said first and second signals switches state after said clock goes high and which maintains said output signal at said next state when said clock next goes low regardless of any change of state of said second signal.

14. The integrated circuit of claim 13, wherein:
said combinatorial logic provides a plurality of data signals; and
wherein said first precharge circuit asserts said first signal high while said clock is low, maintains said first signal high after said clock goes high when each of said plurality of data signals is low, asserts said first signal low if any of said plurality of signals are high when said clock goes high, and keeps said first signal asserted low while said clock is high if said first signal was asserted low when said clock went high.

15. The integrated circuit of claim 13, wherein:
said combinatorial logic provides a plurality of data signals;
wherein said first precharge circuit comprises a plurality of first precharge circuits, each precharging a corresponding one of a plurality of first signals high while said clock is low, each maintaining a corresponding one of said plurality of said first signals high after said clock goes high and a corresponding one of a plurality of data signals is low, each asserting a corresponding one of said plurality of first signals low if a corresponding one of said plurality of data signals is high when said clock goes high, and each keeping a corresponding one of said plurality of first signals asserted low while said clock is high if said corresponding first signal was asserted low when said clock went high; and
wherein said second precharge circuit asserts said second signal high while said clock is low, asserts said second signal low if at least one of said plurality of first signals remains high after said clock goes high, and keeps a state of said second signal immediately after any one of said plurality of first signals and said second signal switches state while said clock is high.

16. A method of registering data, comprising:
precharging a first precharge node high while a clock node is low;
maintaining the first precharge node high after the clock node goes high when a data node is low;
discharging the first precharge node low if the data node is high when the clock node goes high;
keeping the first precharge node discharged low while the clock node is high if the first precharge node was discharged low when the clock node went high regardless of any change of the data node while the clock node is high;
precharging a second precharge node high while the clock node is low;
discharging the second precharge node low if the first precharge node remains high after the clock node went high;
keeping a state of the second precharge node immediately after either one of the first and second precharge nodes switches state while the clock node is high; and
asserting an output node to a next state based on the second precharge node immediately after either one of the first and second precharge nodes switches state after the clock node goes high and maintaining the output node at the next state when the clock node next goes low regardless of any change of state of the second precharge node.

17. The method of claim 16, further comprising:
maintaining the first precharge node high after the clock node goes high when each of a plurality of data nodes is low; and
discharging the first precharge node low if any of the plurality of data nodes are high when the clock node goes high.

18. The method of claim 16, further comprising:
precharging a plurality of first precharge nodes high while the clock node is low;
maintaining a corresponding one of the plurality of said first precharge nodes high after the clock node goes high when a corresponding one of a plurality of data nodes is low;
discharging a corresponding one of the plurality of first precharge nodes low if a corresponding one of the plurality of data nodes is high when the clock node goes high;
keeping a corresponding one of the plurality of first precharge nodes discharged low while the clock node is high if the corresponding first precharge node was discharged low when the clock node went high;
precharging the second precharge node high while the clock node is low; and
discharging the second precharge node low if at least one of the plurality of first precharge nodes remains high after the clock node goes high.

* * * * *